United States Patent [19]

Partovi et al.

[11] Patent Number: 5,963,059
[45] Date of Patent: Oct. 5, 1999

[54] PHASE FREQUENCY DETECTOR HAVING REDUCED BLIND SPOT

[75] Inventors: Hamid Partovi, Sunnyvale, Calif.; Ronald F. Talaga, Jr., Austin, Tex.

[73] Assignee: Advanced Micro Devices, Inc., Sunnyvale, Calif.

[21] Appl. No.: 08/993,340

[22] Filed: Dec. 19, 1997

[51] Int. Cl.$^6$ .............................. H03D 3/20; H03D 13/00
[52] U.S. Cl. ................................ 327/12; 327/7; 331/1 A; 331/25
[58] Field of Search ................................... 327/12, 10, 7, 327/3, 2, 42, 43; 331/1 A, 25

[56] References Cited

U.S. PATENT DOCUMENTS

| | | | |
|---|---|---|---|
| 5,172,397 | 12/1992 | Llewellyn | 327/141 |
| 5,271,040 | 12/1993 | Clark | 327/231 |
| 5,319,680 | 6/1994 | Port et al. | 331/2 |
| 5,699,387 | 12/1997 | Seto et al. | 327/157 |
| 5,736,872 | 4/1998 | Sharma et al. | 327/3 |

OTHER PUBLICATIONS

Von Kaenel, et al., "A 320MHz, 1.5mW at 1.35V CMOS PLL for Microprocessor Clock Generation," ISSCC96/Session 8/Digital Clocks and Latches/Paper FA 8.2, pp. 132–133.
"5.2 Phase and Frequency Detectors," Tutorial, Pre–1997, pp. 21–26.

*Primary Examiner*—Timothy P. Callahan
*Assistant Examiner*—Terry L. Englund
*Attorney, Agent, or Firm*—Conley, Rose & Tayon, PC; B. Noel Kivlin

[57] ABSTRACT

A phase-frequency detector provides a decreased blind spot near 360° of phase error and a resulting increased phase error detection range. In one embodiment, the phase-frequency detector includes two latches that are set in response to the detection of positive transitions in respective input clock signals. A reset controller resets both latches when they both get set. The duration and sequence of the latch states are thereby indicative of phase errors between the input clock signals. Two edge-triggered pulse generators provide a sustained indication of a detected positive transition in the respective input clock signals. When the time duration of the sustained indications is set equal to the reset time required by the latches and reset controller, the blind spot of the phase-frequency detector is largely eliminated.

18 Claims, 4 Drawing Sheets

| PFD | UP/DN Pulse-width (ps) | PLL Lock Time (μs) | TCLK→Q (ps) | TQ→RST (ps) | TRST→Q (ps) | TSLACK (ps) | TBLIND (ps) |
|---|---|---|---|---|---|---|---|
| Classical Nand 1.5V | 453 | 13.0 | 162 | 461 | 260 | 0 | 1330 |
| von Kaenel 1.5V | 609 | 13.8 | 365 | 495 | 324 | 0 | 1750 |
| ETL 1.5V | 436 | 11.7 | 136 | 254 | 142 | 697 | 110 |
| Classical Nand 2.5V | 250 | 7.4 | 87 | 252 | 187 | 0 | 710 |
| von Kaenel 2.5V | 350 | 7.9 | 185 | 277 | 182 | 0 | 920 |
| ETL 2.5V | 216 | 7.0 | 65 | 126 | 73 | 370 | 30 |

FIG. 9

PHASE FREQUENCY DETECTOR HAVING REDUCED BLIND SPOT

BACKGROUND OF THE INVENTION

1. Field of the Invention

This invention relates to the field of phase-lock loops, and in particular to a phase/frequency detector having a reduced blind spot.

2. Description of the Related Art

FIG. 1 shows a classic phase-lock loop (PLL) 100 configured to operate as a frequency multiplier. This is an illustrative application of a PLL which is chosen from a wide variety of well known applications. Three components that are present in every PLL are the phase detector 102, the charge pump and/or filter 104, and the voltage controlled oscillator 106. The phase detector 102 measures the phase difference between incoming clock signals and produces a phase error signal indicative of whether the reference signal should be shifted upward or downward in phase. The error signal produced by the phase detector 102 is processed by the charge pump and/or filter 104 to produce a control voltage. The voltage controlled oscillator 106 provides an output clock signal with a frequency that is controlled by the control voltage. As the control voltage increases or decreases, the output clock frequency increases or decreases correspondingly. In the frequency multiplier configuration shown in FIG. 1, the output clock signal is fed back to the phase detector through a frequency divider 108. The frequency divider 108 produces a reference frequency which is a fraction of the output clock frequency. Hence, when the reference frequency is "locked" to the input clock frequency, the output clock frequency is a multiple of the input clock frequency.

Microprocessor frequencies are getting higher every year. PLL designs must be constantly improved to keep up. Most of the PLL design effort is spent in the voltage-controlled oscillator and charge pump design. The other critical component, the phase detector has not seen significant improvement, and has remained almost unchanged. Yet many parameters of PLLs, including tracking range, acquisition range, loop gain, and transient response, depend on the properties of the phase detectors employed.

Existing phase detector designs are characterized by the following properties: (1) the input-phase difference range for which the error signal is monotonic, (2) the response to unequal input frequencies, and (3) the response to varying input signal amplitudes and duty cycles.

The well-known Gilbert cell is an analog signal multiplier, which for sinusoidal signals, produces a DC value proportional to the cosine of the phase difference for small phase differences. The response of the Gilbert cell is highly sensitive to the amplitude and duty cycle of the input frequencies, which is generally undesirable. The amplitude sensitivity may be eliminated by increasing the gain of the multiplier so that the output signal saturates, and the Gilbert cell acts like an XOR gate. The average DC value of the XOR gate has the phase-difference response shown in FIG. 2. The range for which the DC output is monotonic is for phase errors between 0 and $\pi$ (180°).

An R-S flip flop such as that shown in FIG. 5 may also be used as a phase detector. Although a NOR implementation is shown, NAND implementations are also popular. The R-S flip flop is configured so that a rising edge of the input clock signal latches the output high. The rising edge of the reference clock signal then resets the latch, return the output to low. The average DC response of this phase detector is insensitive to variations of the clock duty cycle of the input signal, and is shown in FIG. 3. The phase error range for which the DC output is monotonic is between 0 and $2\pi$ (360°).

The type of detector most commonly used in PLLs is a phase-frequency detector (PFD). A PFD has two non-complementary outputs. The first output (the UP signal) is driven high if a rising edge of the input clock precedes a rising edge of the reference clock. The second output (the DowN signal) is driven high if a rising edge of the reference clock precedes a rising edge of the input clock. In both cases, the second rising edge resets both outputs low. A state diagram illustrating this behavior is shown in FIG. 6. The resulting response of the PFD is shown in FIG. 4. The range for which the DC output is monotonic is between $-2\pi$ to $+2\pi$. FIG. 7 shows an R-S flip flop implementation of the PFD.

It is noted that the detector responses shown in FIGS. 2, 3 and 4 represent ideal responses, and that the actual responses of implemented phase detectors depart from the ideal. PFDs suffer from two non-ideal characteristics termed: the "dead zone" and the "blind spot". The dead zone is a region near zero phase error ($\Delta\phi=0$) in which the edges of the input and reference signals are so close together that the UP and DN outputs are not provided with sufficient opportunity to fully switch and thereby drive the charge pump. As a result, the response to a small phase error is less than it should be, i.e. the response is "deadened". This problem has been dealt with in the past by reducing the propagation time from detector input to output (to make the dead zone smaller) and by allowing both the UP and DN outputs to go high at the same time during the reset (to reduce the deadening effect).

The blind spot is the region near $\pm 2\pi$ in which the leading edge of a subsequent cycle is arriving during the reset of the PFD, i.e. while the PFD is "blind". The effect of the blind spot is to decrease the range in which the PFD is monotonic, thereby reducing tracking range and pull-in range, and increasing lock acquisition time. It is desirable to provide a PFD with a response that closely approximates the ideal phase error response.

SUMMARY OF THE INVENTION

The problems outlined above are in large part solved by a phase-frequency detector having a decreased blind spot near 360° of phase error and a resulting increased phase error detection range. In one embodiment, the phase-frequency detector includes two latches that are set in response to the detection of positive transitions in respective input clock signals. A reset controller resets both latches when they both get set. The duration and sequence of the latch states are thereby indicative of phase errors between the input clock signals. Two edge-triggered pulse generators are included to provide a sustained indication of a detected positive transition in the respective input clock signals. When the time duration of the sustained indications is set equal to the reset time required by the latches and reset controller, the blind spot of the phase-frequency detector is largely eliminated.

The elimination of the blind spot provides the PFD with a monotonic phase error response over a phase error range of nearly 720°. This increased range advantageously shortens PLL lock-in time and may provide greater resistance to loss of phase lock when highly variable clock frequencies are encountered. Additionally, the PFD may be used with clock signals of much higher frequencies without any additional complexity or additional costs being incurred.

BRIEF DESCRIPTION OF THE DRAWINGS

Other objects and advantages of the invention will become apparent upon reading the following detailed description and upon reference to the accompanying drawings in which:

FIG. 9 compares the characteristic time durations of alternate PFD implementations.

Figure 1:
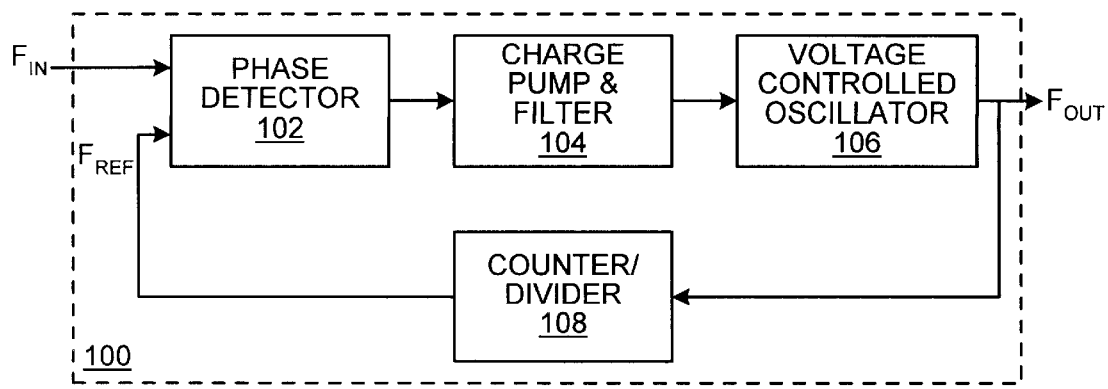
FIG. 1 shows a PLL configured as a frequency multiplier.
Figure 2:
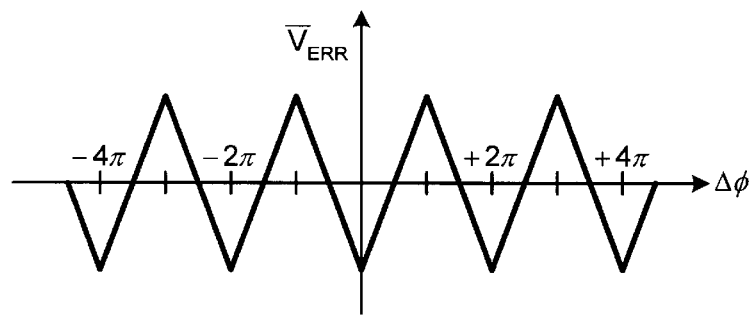
FIG. 2 shows the ideal response of a XOR gate phase detector.
Figure 3:
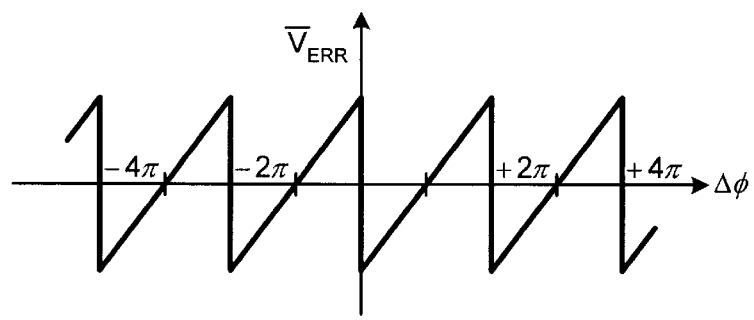
FIG. 3 shows the ideal response of an R-S flip flop phase detector.
Figure 4:
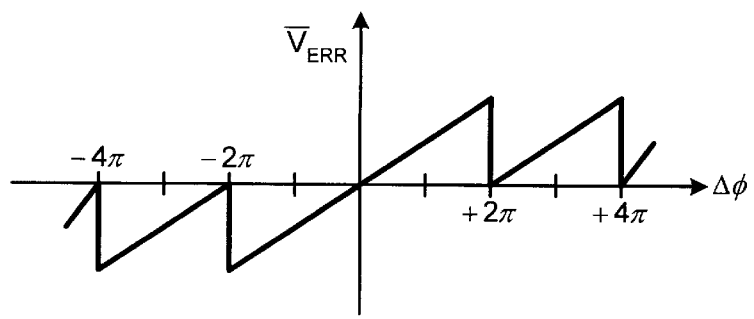
FIG. 4 shows the ideal response of a PFD.
Figure 5:
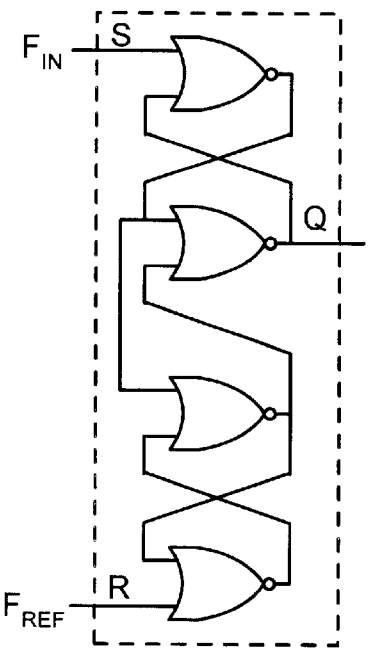
FIG. 5 shows one implementation of an R-S latch.
Figure 6:
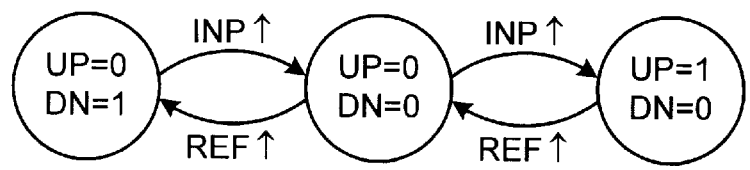
FIG. 6 shows the state diagram of a PFD.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 7:
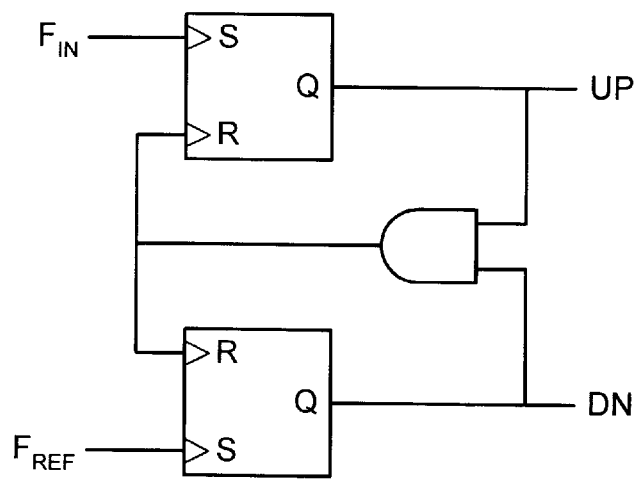
FIG. 7 shows one implementation of a PFD.

As discussed previously, the blind spot of a PFD is the region near $\pm 2\pi$ in which the leading edge of a subsequent cycle is arriving during the reset of the PFD. Returning to FIG. 7, assuming balanced gates and equal delays for the flip flops, the prior art PFD shown is "blind" to an incoming input edge for the following time period:

$$T_{BLIND} = T_{CLK \to Q} + T_{Q \to R} + T_{R \to Q} + T_{Q \to R}$$

Reduction of this time period may be achieved by decreasing each of the propagation delay terms, but a practical limit is imposed by the device switching speeds. At the high frequencies being employed in many modern microprocessors, this limit may still be a large fraction of the clock cycle.

Figure 8:
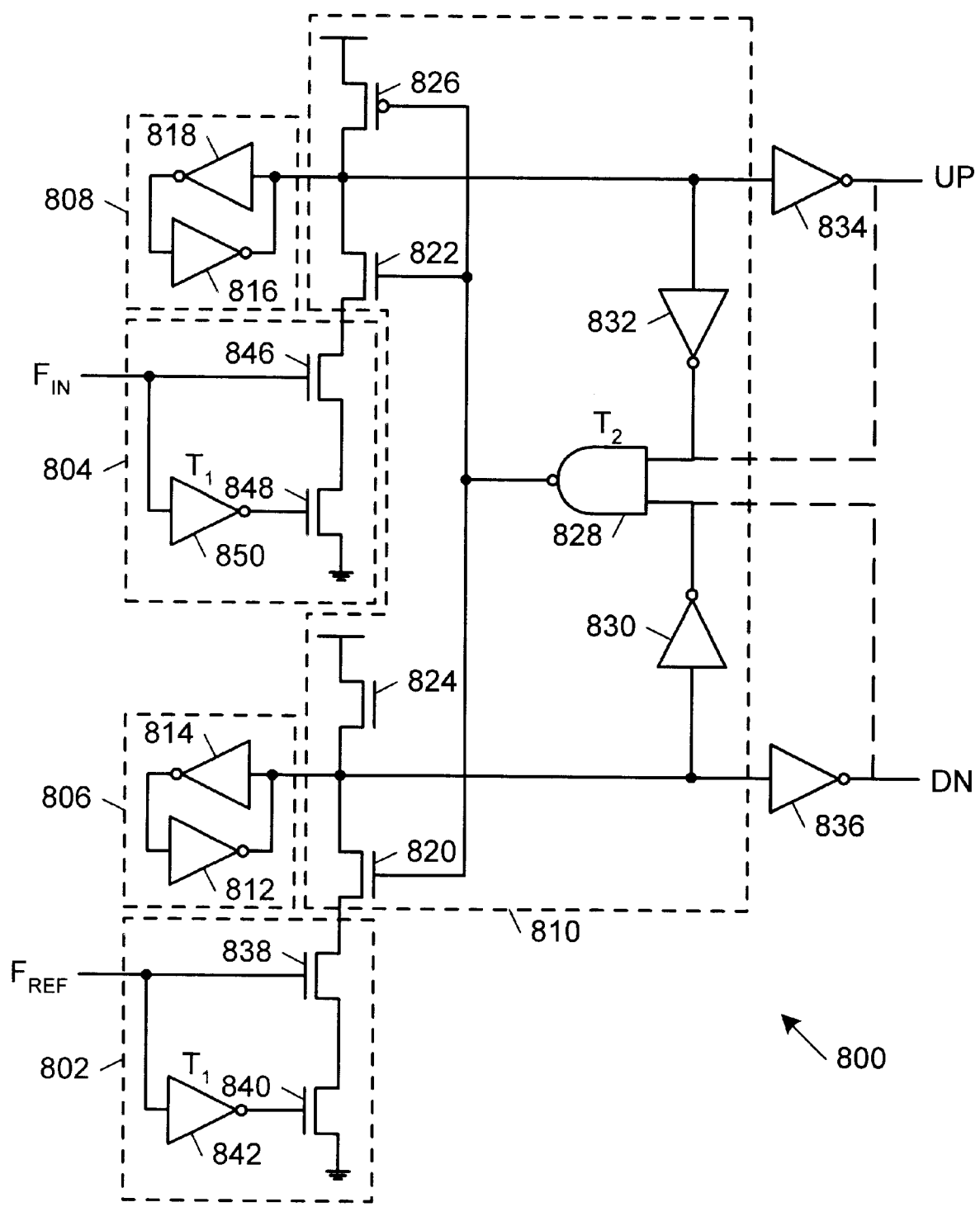
FIG. 8 shows an implementation of a PFD having a reduced blind spot.

Turning now to FIG. 8, one embodiment of an improved PFD 800 is shown. PFD 800 includes two edge-triggered one-shot pulse generators 802 and 804, two latches 806 and 808, and reset controller 810. Latch 806 consists of two inverters 812 and 814 with the output of each coupled to the input of the other so as to provide a latch capable of holding a selected state. Similarly, inverters 816 and 818 are coupled to form latch 808.

Reset controller 810 includes isolation transistors 820 and 822 by which the latches 806 and 808 are respectively coupled to the pulse generators 802 and 804. When a reset signal is asserted (i.e. driven low in this implementation), the isolation transistors isolate the latches from the influence of the pulse generators. Reset controller 810 also includes reset transistors 824 and 826 which respectively couple the latches 806 and 808 to a logical high voltage. When the reset signal is asserted, the reset transistors 824 and 826 reset the latches 806 and 808 to a high state. Once latches 806 and 808 have returned to a high state, the reset signal is de-asserted. In the embodiment shown, the reset signal is asserted and de-asserted by NAND gate 828. NAND gate 828 is coupled to monitor the states of the latches 806 and 808 via inverters 830 and 832, respectively. When both latches are set to a low state, the NAND gate 828 asserts the reset signal to restore the latches to the high state. The desired UP and DN output signals can be driven from numerous points in the circuit, including directly from the latches 806 and 808, or from the inputs to NAND gate 828 (as indicated by the broken lines), or from the state set point of reset controller 810 as shown. The correct polarity for the UP and DN signals is provided in this case by inverting drivers 834 and 836, respectively.

Edge-triggered one-shot pulse generator 802 includes a start transistor 838 and a stop transistor 840 connected in series between isolation transistor 820 and a logical low voltage. Inverter 842 is coupled between the gates of the start transistor 838 and the stop transistor 840, and is provided with a preset propagation delay that controls the width of the generated pulse. When the input signal provided to the start transistor 838 is low, inverter 842 drives the gate of the stop transistor 840 high, so that it is in a conductive state. When the input signal provided to start transistor 838 transitions to high, both transistors are simultaneously conductive for the length of the preset propagation delay of inverter 842. If the reset signal is not being asserted, this allows latch 806 to be set low. Thereafter, when the positive-going transition propagates through inverter 842, the stop transistor 840 becomes non-conductive, and the pull-down influence exerted on latch 806 ends. Edge triggered one shot pulse generator 804 includes a start transistor 846, a stop transistor 848, and an inverter 850 which are configured to operate in the same way to exert a pull-down influence on latch 808.

Two adjustable predetermined delays, T1 and T2 are provided in the implementation of PFD 800. T1 is the propagation delay of inverters 842 and 850, and it determines the duration of the pull-down influence that an incoming positive transition exerts on a latch. T2 is the propagation delay of NAND gate 828, and it is used to adjust the minimum duration of an assertion of the UP and DN signals. The propagation delay may be implemented using multiple devices, "slow" devices, capacitors, and/or other well known delay techniques.

An analysis of FIG. 8 reveals that PFD 800 is "blind" to an incoming input edge for the following time period:

$$T_{BLIND} = -T_{PULSE} + T_{CLK \to Q} + T_{Q \to R} + T_{R \to Q} + T_{Q \to R}$$

The negative term $-T_{PULSE}$ has been introduced by the edge-triggered one-shot pulse generator, and is equal to the propagation delay T1 of the inverters 842 and 850. By setting this value equal to the positive terms in the above equation, the "blind spot" of PFD 800 may in principle be entirely eliminated. What this means in terms of the circuit behavior is that the pulse generators sustain the detection of an incoming edge even as the latches are being reset, so that when the reset is complete, the edge detection may then be latched.

Several constraints should be observed when determining T1 and T2. T2 should be set with an eye to eliminating the dead zone and maintaining linearity of the PFD response. Since T2 affects terms in the above equation, it should be set before T1. Under no operating conditions or process variation can $T_{PULSE}$ be allowed to exceed the positive terms in the above equation by much (e.g. the set-up time of the latch), since this would then undesirably result in a single edge triggering the PFD twice when the PFD is operating in steady state, which would in turn cause a large phase error detection when none is present. Nonetheless, judicious setting of T1 will provide for a drastic reduction of the PFD blind spot.

FIG. 9 provides a comparison of an implementation of PFD 800 (hereafter Edge-Triggered Latch PFD, or simply ETL) with implementations of a classical NAND-based PFD and a novel PFD, both of which are discussed in "A 320 MHz, 1.5 mW at 1.35V CMOS PLL for Microprocessor Clock Generation," published February 1996 by Vincent von Kaenel et al. on pages 132–133 of the ISSCC Digest of Technical Papers. Simulations were done in AMD's 0.25 μm CMOS logic process, which is nominally a 2.5V process. Simulations were done at both 1.5V and 2.5V to show the effects of voltage scaling, and all simulations were done using a 100 MHz frequency. All delays were measured at 50% crossing points, although gates with skewed trip points were used. For this reason, numbers may be slightly off from the above formulas.

At both 1.5V and 2.5V, the ETL provided reduced lock-in time, achieving steady state 10% and 5% faster, respectively, than the next best PFD. This is primarily due to the nearly ideal PFD response. The blind spot is reduced from roughly 15% of a clock cycle (54°!) to 1.1% of a clock cycle (4°) in the 1.5V simulation, and from roughly 8% of a clock cycle (29%) to 0.3% of a clock cycle (1°). Hence the ETL provides an easy method for minimizing the blind spot of a PFD and keeping it to less than a desired fraction, say 10% of a clock cycle. As clock frequencies continue to increase, the ETL may provide the best solution for inherent propagation delays in implemented devices.

Numerous variations and modifications will become apparent to those skilled in the art once the above disclosure is fully appreciated. For example, various implementations of latches, reset controllers, and edge-triggered pulse generators may be used. It is intended that the following claims be interpreted to embrace all such variations and modifications.

What is claimed is:

1. A phase-frequency detector which comprises:

a first latch configured to hold a first state when reset and a second state when set;

a second latch configured to hold the first state when reset and the second state when set;

a reset controller coupled to the first and second latches and configured to reset the first and second latches when both the first and second latches are set;

a first edge-triggered pulse generator coupled to the first latch and configured to set the first latch in response to a transition in a first clock signal; and a second edge-triggered pulse generator coupled to the second latch and configured to set the second latch in response to a transition in a second clock signal, wherein the first and second pulse generators are respectively coupled to the first and second latches via the reset controller, wherein the reset controller is configured to isolate the first and second latches from the first and second pulse generators while the reset controller is resetting the first and second latches.

2. The phase-frequency detector of claim 1, wherein the first and second edge-triggered pulse generators respectively set the first and second latches by providing a logic value for an interval having a pulse duration $T_{PULSE}$.

3. The phase-frequency detector of claim 2, wherein the first and second edge-triggered pulse generators have a propagation delay $T_{CLK \to Q}$, wherein the reset controller has a detection path delay $T_{Q \to R}$ and an assertion path delay $T_{R \to Q}$, and wherein the pulse duration $T_{PULSE}$ is substantially equal to $T_{CLK \to Q} + 2T_{Q \to R} + T_{R \to Q}$.

4. The phase-frequency detector of claim 2, wherein the first and second edge-triggered pulse generators have a propagation delay $T_{CLK \to Q}$, wherein the reset controller has a detection path delay $T_{Q \to R}$ and an assertion path delay $T_{R \to Q}$, and wherein the difference between pulse duration $T_{PULSE}$ and $T_{CLK \to Q} + 2T_{Q \to R} + T_{R \to Q}$ is less than 10% of a clock cycle of the second clock signal.

5. The phase-frequency detector of claim 1, wherein the reset controller comprises:

a first isolation transistor coupled between the first latch and the first pulse generator, wherein the first isolation transistor is configured to isolate the first latch from the first pulse generator when a reset signal is asserted;

a first reset transistor coupled between a first logic value and the first latch, wherein the first reset transistor is configured to reset the first latch when the reset signal is asserted;

a second isolation transistor coupled between the second latch and the second pulse generator, wherein the second isolation transistor is configured to isolate the second latch from the second pulse generator when the reset signal is asserted; and a second reset transistor coupled between the first logic value and the second latch, wherein the second reset transistor is configured to reset the second latch when the reset signal is asserted.

6. The phase-frequency detector of claim 5, wherein the reset controller further comprises a logic gate coupled to the first and second latches and configured to assert the reset signal when both the first and second latches are holding the second state, wherein the logic gate is configured to provide a predetermined propagation delay which determines a minimum output pulse width for the reset controller.

7. The phase-frequency detector of claim 6, wherein the reset controller is coupled to first and second output drivers which drive first and second output signals indicative of phase differences between the first and second clock signals.

8. The phase-frequency detector of claim 1, wherein the first edge-triggered pulse generator comprises:

a start transistor coupled to receive the first clock signal and configured to be conductive when the first clock signal is asserted;

a time-delay inverter configured with a predetermined propagation delay $T_{PULSE}$, wherein the time-delay inverter is coupled to receive and invert the first clock signal; and a stop transistor coupled in series with the start transistor, coupled to receive an output signal from the time-delay inverter, and configured to be conductive when the output signal is asserted.

9. The phase-frequency detector of claim 1, wherein the first latch comprises:

an inverting set gate coupled to the reset controller to receive a desired state value and configured to invert the desired state value and to provide the inverted desired state value; and an inverting hold gate coupled to receive the inverted desired state value from the inverting set gate and configured to invert the inverted desired state value and to provide the desired state value to the inverting set gate.

10. A method for performing phase error detection over an extended phase error range, wherein the method comprises:

detecting a first positive transition in a first clock signal and providing a first sustained indication of the first positive transition;

setting a first latch in response to the first sustained indication;

asserting a first output while the first latch is set;

detecting a second positive transition in a second clock signal and providing a second sustained indication of the second positive transition;

setting a second latch in response to the second sustained indication;

asserting a second output while the second latch is set; and resetting the first and second latches in response to both the first and second latches being set, wherein the resetting is performed by a reset controller, and wherein the first and second latches are respectively coupled to first and second pulse generators via the reset controller, wherein the reset controller isolates the first and second latches from the first and second pulse generators during the resetting.

11. The method of claim 10, wherein the first sustained indication is sustained for a time duration greater than the minimum total time required for the setting of the first latch and a consequent resetting of the first and second latches.

12. A phase-frequency detector which comprises:
a first latch configured to hold a first state when reset and a second state when set;
a second latch configured to hold the first state when reset and the second state when set;
a reset controller coupled to the first and second latches and configured to reset the first and second latches when both the first and second latches are set;
a first edge-triggered pulse generator coupled to the first latch and configured to set the first latch in response to a transition in a first clock signal; and
a second edge-triggered pulse generator coupled to the second latch and configured to set the second latch in response to a transition in a second clock signal;
wherein the first and second edge-triggered pulse generators respectively set the first and second latches by providing a logic value for an interval having a pulse duration $T_{PULSE}$; and
wherein the first and second edge-triggered pulse generators have a propagation delay $T_{CLK \rightarrow Q}$, wherein the reset controller has a detection path delay $T_{Q \rightarrow R}$ and an assertion path delay $T_{R \rightarrow Q}$, and wherein the pulse duration $T_{PULSE}$ is substantially equal to $T_{CLK \rightarrow Q} + 2T_{Q \rightarrow R} + T_{R \rightarrow Q}$.

13. A phase-frequency detector which comprises:
a first latch configured to hold a first state when reset and a second state when set;
a second latch configured to hold the first state when reset and the second state when set;
a reset controller coupled to the first and second latches and configured to reset the first and second latches when both the first and second latches are set;
a first edge-triggered pulse generator coupled to the first latch and configured to set the first latch in response to a transition in a first clock signal; and
a second edge-triggered pulse generator coupled to the second latch and configured to set the second latch in response to a transition in a second clock signal;
wherein the first and second edge-triggered pulse generators respectively set the first and second latches by providing a logic value for an interval having a pulse duration $T_{PULSE}$; and
wherein the first and second edge-triggered pulse generators have a propagation delay $T_{CLK \rightarrow Q}$, wherein the reset controller has a detection path delay $T_{Q \rightarrow R}$ and an assertion path delay $T_{R \rightarrow Q}$, and wherein the difference between pulse duration $T_{PULSE}$ and $T_{CLK \rightarrow Q} + 2T_{Q \rightarrow R} + T_{R \rightarrow Q}$ is less than 10% of a clock cycle of the second clock signal.

14. The phase-frequency detector of claim 13, wherein the first latch comprises:
an inverting set gate coupled to the reset controller to receive a desired state value and configured to invert the desired state value and to provide the inverted desired state value; and
an inverting hold gate coupled to receive the inverted desired state value from the inverting set gate and configured to invert the inverted desired state value and to provide the desired state value to the inverting set gate.

15. A phase-frequency detector which comprises:
a first latch configured to hold a first state when reset and a second state when set;
a second latch configured to hold the first state when reset and the second state when set;
a reset controller coupled to the first and second latches and configured to reset the first and second latches when both the first and second latches are set;
a first edge-triggered pulse generator coupled to the first latch and configured to set the first latch in response to a transition in a first clock signal; and
a second edge-triggered pulse generator coupled to the second latch and configured to set the second latch in response to a transition in a second clock signal;
wherein the reset controller includes:
a first isolation transistor coupled between the first latch and the first pulse generator, wherein the first isolation transistor is configured to isolate the first latch from the first pulse generator when a reset signal is asserted;
a first reset transistor coupled between a first logic value and the first latch, wherein the first reset transistor is configured to reset the first latch when the reset signal is asserted;
a second isolation transistor coupled between the second latch and the second pulse generator, wherein the second isolation transistor is configured to isolate the second latch from the second pulse generator when the reset signal is asserted; and
a second reset transistor coupled between the first logic value and the second latch, wherein the second reset transistor is configured to reset the second latch when the reset signal is asserted.

16. The phase-frequency detector of claim 15, wherein the reset controller further comprises a logic gate coupled to the first and second latches and configured to assert the reset signal when both the first and second latches are holding the second state, wherein the logic gate is configured to provide a predetermined propagation delay which determines a minimum output pulse width for the reset controller.

17. The phase-frequency detector of claim 16, wherein the reset controller is coupled to first and second output drivers which drive first and second output signals indicative of phase differences between the first and second clock signals.

18. A phase-frequency detector which comprises:
a first latch configured to hold a first state when reset and a second state when set;

a second latch configured to hold the first state when reset and the second state when set;

a reset controller coupled to the first and second latches and configured to reset the first and second latches when both the first and second latches are set;

a first edge-triggered pulse generator coupled to the first latch and configured to set the first latch in response to a transition in a first clock signal; and a second edge-triggered pulse generator coupled to the second latch and configured to set the second latch in response to a transition in a second clock signal;

wherein the first edge-triggered pulse generator comprises:

a start transistor coupled to receive the first clock signal and configured to be conductive when the first clock signal is asserted;

a time-delay inverter configured with a predetermined propagation delay $T_{PULSE}$, wherein the time-delay inverter is coupled to receive and invert the first clock signal; and a stop transistor coupled in series with the start transistor, coupled to receive an output signal from the time-delay inverter, and configured to be conductive when the output signal is asserted.

* * * * *